(12) United States Patent
Johnson et al.

(10) Patent No.: US 7,508,896 B2
(45) Date of Patent: Mar. 24, 2009

(54) CIRCUIT AND METHOD FOR DYNAMICALLY ADJUSTING A FILTER BANDWIDTH

(75) Inventors: Terence L. Johnson, Fairfax, VA (US); Timothy R. Miller, Arlington, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 821 days.

(21) Appl. No.: 11/022,883

(22) Filed: Dec. 28, 2004

(65) Prior Publication Data

US 2006/0140322 A1 Jun. 29, 2006

(51) Int. Cl.
H03D 3/24 (2006.01)
(52) U.S. Cl. ..................................... 375/376
(58) Field of Classification Search ............... 375/327, 375/344, 376; 327/156–159; 329/307–309; 331/1 A, 17, 25, 34
See application file for complete search history.

(56) References Cited

U.S. PATENT DOCUMENTS

| | | | |
|---|---|---|---|
| 3,918,006 A | 11/1975 | Munninghoff et al. | |
| 4,215,430 A | 7/1980 | Johnson, Jr. et al. | |
| 5,179,348 A | 1/1993 | Thompson | |
| 5,189,664 A | 2/1993 | Cheng | |
| 5,495,512 A | 2/1996 | Kovacs et al. | |
| 5,995,563 A * | 11/1999 | Ben-Efraim et al. | ......... 375/344 |
| 6,965,616 B1 | 11/2005 | Quigley et al. | |
| 2003/0091122 A1 | 5/2003 | Humphreys et al. | |
| 2004/0048595 A1 | 3/2004 | Miller et al. | |
| 2005/0141655 A1* | 6/2005 | Lee et al. | ..................... 375/344 |

OTHER PUBLICATIONS

Notification Concerning Transmittal of International Preliminary Report on Patentability dated Jul. 12, 2007 in corresponding PCT application No. PCT/US2005/045543.
Search Report from Patent Cooperation Treaty issued on Oct. 31, 2006 for the corresponding PCT patent application No. PCT/US05/044974 (a copy and English translation thereof).

* cited by examiner

*Primary Examiner*—Don N Vo

(57) ABSTRACT

A tracking circuit (100) is provided for controlling a locally-generated clock. A receive channel (110) in the tracking circuit receives an incoming signal and a local clock, generates a local signal based on the local clock, and compares the local signal and the incoming signal to generate a data signal and an unfiltered phase error signal. A loop filter (120) filters the unfiltered phase error signal to provide a filtered phase error signal. A numerically controlled oscillator (140) generates a correction clock based on the filtered phase error signal. And a filter control circuit (160) provides one or more filter control signals to control operational parameters of the loop filter. The correction clock is provided to the receive channel to modify at least one of the phase and frequency of the local clock. In addition, a sample switch (125) may also be provided to sample the unfiltered phase error signal.

20 Claims, 4 Drawing Sheets

CIRCUIT AND METHOD FOR DYNAMICALLY ADJUSTING A FILTER BANDWIDTH

CROSS-REFERENCE TO RELATED PATENT DOCUMENTS

This application is related to U.S. application Ser. No. 10/654,922, filed Sep. 5, 2003, entitled "METHOD AND APPARATUS FOR ACQUIRING AND TRACKING ULTRAWIDE BANDWIDTH SIGNALS," published on Mar. 11, 2004, as U.S. Patent Application Publication No. US 2004/0048595 A1, the entire contents of which is hereby incorporated by reference in its entirety.

FIELD OF THE INVENTION

The present invention relates in general to communication systems, such as wireless ultra wideband (UWB) systems, including mobile transceivers, centralized transceivers, related equipment, and corresponding methods. In particular, the present invention relates to a circuit in a receiver and related method used to dynamically adjust the bandwidth of a loop filter used in a tracking process. More specifically, the present invention relates to a circuit and method for quickly locking onto a desired signal frequency in a locally-generated clock by adjusting the bandwidth in a loop filter used in the local clock generator.

BACKGROUND OF THE INVENTION

In one type of data transmission system, a transmitter will send data across a medium encoded in wavelets (or groups of wavelets, often called code words). The receiver will demodulate the incoming signal by correlating it (i.e., mixing it) with locally generated copies of the wavelets (or code words) used for initial encoding. By examining the correlation result between the incoming signal and the local signal, the receiver can determine the values of the incoming data bits.

However, in such a system, it is necessary to synchronize a local clock in the receiver to the remote clock in the transmitter that was used to generate the wavelets that make up the transmitted signals. This is so that the locally-generated wavelets will be in phase with the wavelets sent by the transmitter, and the correlation result will accurately predict bit values in the incoming signal.

Because transmitter clock and a receiver clock will generally be operating at phases that are initially unrelated to each other, it is necessary to adjust the phase of the local clock to that of the remote clock. Furthermore, it may also be necessary to adjust the frequency of the local clock to match that of the remote clock. This may be because of minor variations in clock frequency between a local clock and a remote clock with the same nominal frequency, or it may result from the use of set frequency offsets in the transmitter clock from a nominal transmitter frequency.

One way to accomplish this frequency adjustment is by a system of acquisition and tracking. During an acquisition process, a receiver determines the phase and frequency of the transmitter clock and matches its locally-generated clock with the acquired phase and frequency of the transmitter's clock. During a tracking process, the receiver begins with the acquired phase and frequency, but monitors the incoming signal to maintain the phase and frequency lock.

However, at the switch from acquisition to tracking there may be some drift in the phase and frequency of the local clock as the receiver circuitry moves from acquisition to tracking. It is therefore desirable for the tracking circuitry to both quickly settle back into the proper phase and frequency for the local clock at the start of the tracking process, and also to maintain the phase and frequency lock with a minimum of power expenditure during the remainder of the tracking process.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

Tracking Circuitry

Figure 1:
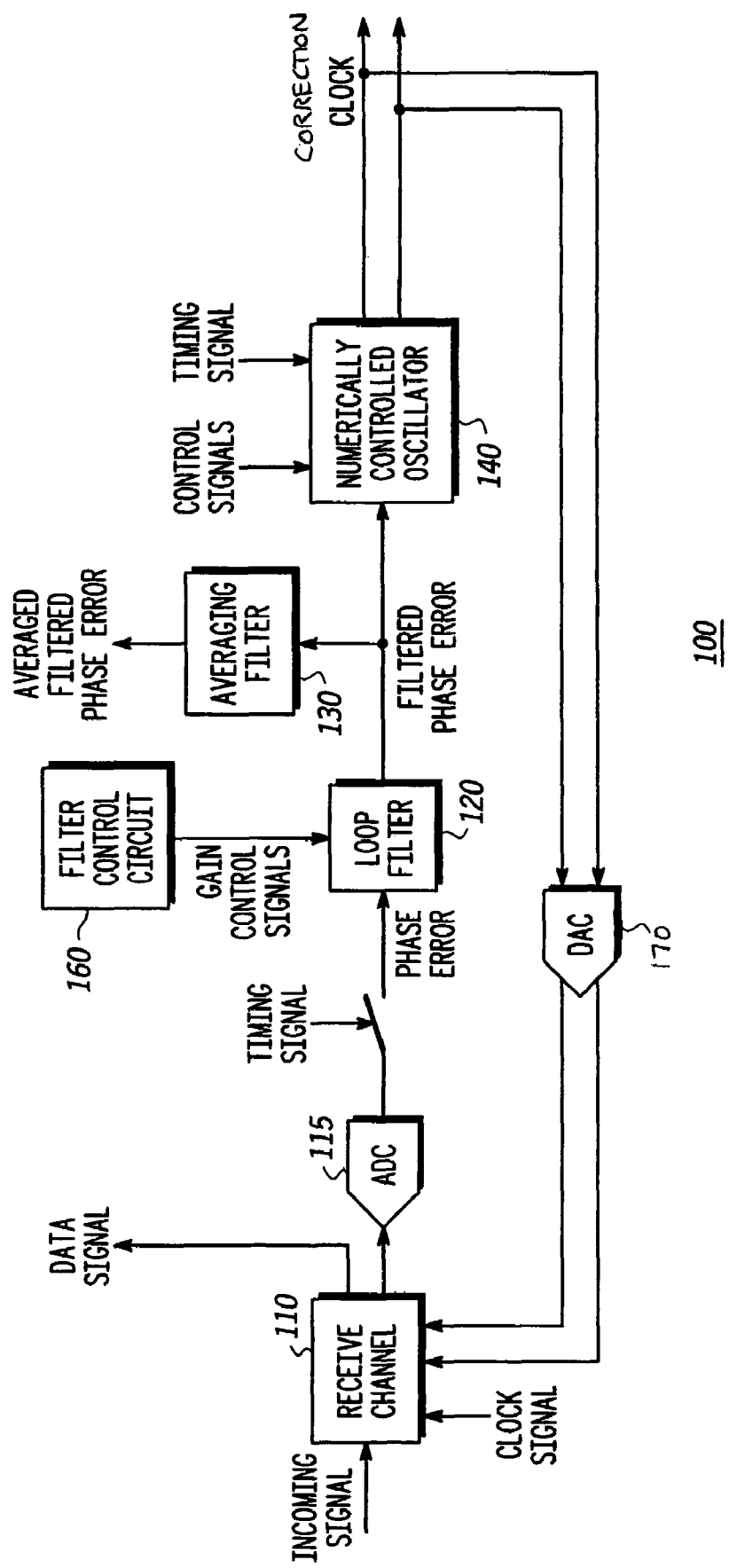
FIG. 1 is a diagram of a tracking circuit including a local clock generator having a loop filter, according to a disclosed embodiment of the present invention.

FIG. 1 is a diagram of a tracking circuit including a local clock generator having a loop filter, according to a disclosed embodiment of the present invention. As shown in FIG. 1, the tracking circuit includes a receive channel 110, an analog-to-digital converter (ADC) 115, a loop filter 120, a sample switch 125, an averaging filter 130, a numerically-controlled oscillator (NCO) 140, a filter control circuit 160, and a digital-to-analog converter (DAC) 170.

In operation this circuit takes a signal received from a transmitter device and produces a local clock signal that is set at (or at least converges to) a phase and frequency that is synchronized to the phase and frequency of the received signal.

The receive channel 110 takes the received signal from the transmitter (e.g., via a receiver antenna) and provides a phase error signal indicative as to whether the phase of the local clock is matched with that of the incoming signal, whether the phase of the local clock is leading that of the incoming signal, or whether the phase of the local clock is lagging that of the incoming signal. In this embodiment the receive channel also provides a data signal that is used to demodulate the incoming signal when the receiver is properly synchronized.

One way to accomplish these functions is to mix the incoming signal with the locally generated signal and delay it twice by the same delay length. The once-delayed signal becomes an on-time data signal for which synchronization is desired. The difference between the zero-delayed signal and the twice-delayed signal is indicative of the rate of phase drift between the two clock signals. A zero difference between these signals indicates aligned phases; a positive difference between these signals indicates that the local clock is lagging in phase; and a negative difference between these signals indicates that the local clock is leading in phase. An exemplary discussion regarding how the on-time and phase error signal can be generated is provided in U.S. patent application Ser. No. 10/214,183, filed Aug. 8, 2002, for "MODE CONTROLLER FOR SIGNAL ACQUISITION AND TRACKING IN AN ULTRA WIDEBAND COMMUNICATION SYSTEM," the contents of which are hereby incorporated by reference in their entirety.

The ADC 115 converts the analog phase error signal into a digital phase error signal for further digital processing.

The sample switch 125 operates at a set sample rate determined by a timing signal to provide digital phase error values to the loop filter 120. At each cycle of the timing signal, the sample switch 125 latches a current value of the digital phase error signal and holds it until the next cycle of the timing signal. In embodiments where the sample rate can be altered, the timing signal can be varied to reflect different sample rates.

The loop filter 120 in this embodiment is a proportional and integral (PI) digital filter, also referred to as a type 2 digital filter. Since the loop filter 120 has an integral term, the filtered phase error will produce zero error when frequency and phase are matched between the local clock signal and the clock of the incoming signal.

The output of the loop filter 120 is a filtered phase error that is used to control the operation of the NCO 140. The filtered phase error is a digital value that is indicative of how large the current phase error is between the locally-generated signal (i.e., the local clock) and the incoming signal (i.e., a transmitter clock).

The averaging filter 130 in this embodiment is used to provide an averaged value of the filtered phase error over multiple samples. This averaged output can be used in different embodiments as starting input value for the NCO 140 in various circumstances, e.g., where the filtered phase error is lost or otherwise loses its efficacy.

The NCO 140 generates a complex local clock based on the filtered phase error, the timing signal, and certain control signals. The complex local clock is a pair of sine and cosine signals at a set phase and frequency that converges on the phase error of the incoming signal during operation. This is used by the receive circuit as a correction clock to correct the phase of the local clock.

The filter control circuit 160 controls the parameters of the loop filter 120 to change its bandwidth during operation. In the disclosed embodiment the filter control circuit 160 provides gain control signals that set the gain of amplifiers in the loop filter 120. These gain values determine the loop natural frequency and loop dampening factor of the loop filter 120, which in turn determine the bandwidth of the loop filter, and how quickly the loop filter 120 will converge on its desired output value, as well as how noisy its convergence will be. One gain value controls the amount of error signal that is input to the proportional, or "P" part of the control loop and fed to the NCO 140, while the other gain signal controls the amount of error signal that is input to the integrator for the "I" portion of the PI control loop.

Initially the filter control circuit 160 provides gain values that have the loop filter 120 operate over a large bandwidth. In This case, the loop filter 120 will quickly converge to a desired output. This allows the loop filter to quickly reach a good approximate value for the filtered phase error, though the resulting convergence will be noisy.

Then as processing continues, the filter control circuit 160 can provide gain values that narrow the operational bandwidth of the loop filter 120. This will decrease both the noise and the convergence speed. However, since operation at a wide bandwidth will have brought the loop filter 120 close to its desired output value, the convergence need not be as quick. In this case, the limitations in slower convergence will be made up for by the reduced noise. If desired, multiple steps can be made to vary convergence and noise to maximize the speed and accuracy of convergence. One may select critically damped, under-damped, or overdamped signal responses, as would be understood by one skilled in the art. In one embodiment a $\zeta$ of 0.707 is used.

The complex local clock output from the NCO 140 is fed back to the receive channel to provide phase and frequency feedback for the circuit 200. The digital-to-analog converter (DAC) 170 converts the digital clock signals output from the NCO 140 into analog clock signals that can be used by the receive channel 110 to modify the local clock.

The receive channel 110 uses the complex local clock signals to modify the phase and frequency of a system clock to generate local wavelets (or code words) that are used to generate the on-time and phase error signals. An exemplary discussion regarding how the complex local clock signals can be used to generate local wavelets is provided in U.S. patent application Ser. No. 10/998,716, filed Nov. 30, 2004, for "SYSTEM AND METHOD FOR USING PROGRAMMABLE FREQUENCY OFFSETS IN A WIRELESS NETWORK," the contents of which are hereby incorporated by reference in their entirety.

Figure 2:
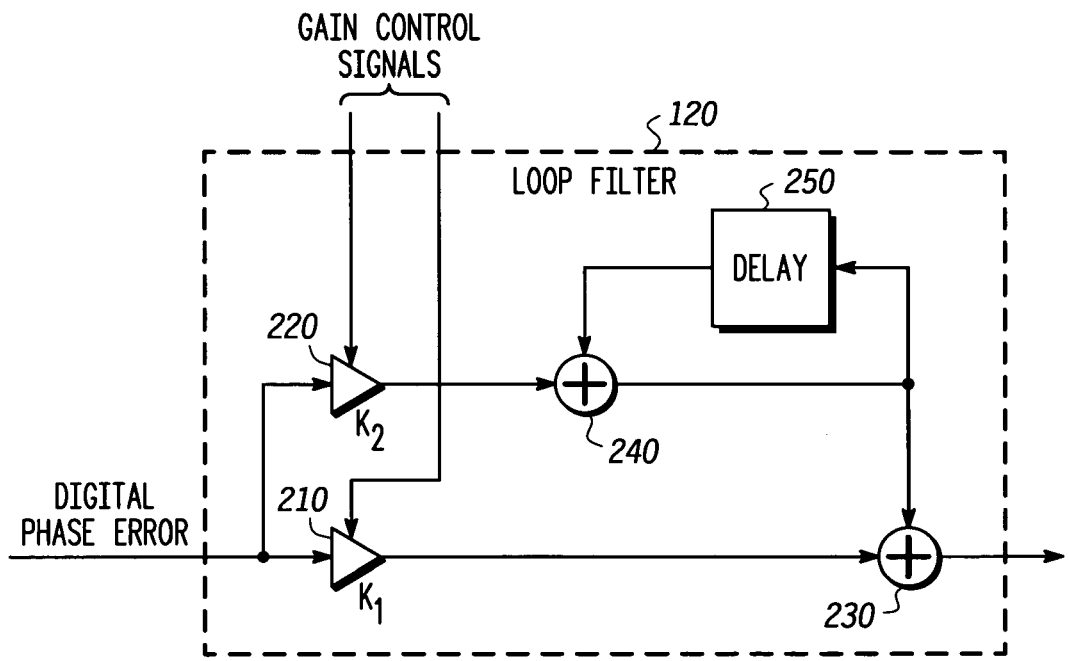
FIG. 2 is a diagram of the loop filter of FIG. 1, according to a disclosed embodiment of the present invention.

FIG. 2 is a diagram of the loop filter of FIG. 1 according to a disclosed embodiment of the present invention. As shown in FIG. 2, the loop filter 120 is a type 2 digital filter that includes a first amplifier 210, a second amplifier 220, a first adder 230, a second adder 240, and a delay circuit 250.

The first amplifier 210 amplifies the digital phase error signal by a first gain value $k_1$ to generate a first amplified signal, while the second amplifier 220 amplifies the digital phase error signal by a second gain value $k_2$ to generate a second amplified signal.

The second adder 240 adds the current value of the second amplified signal with a delayed version of the output of the second adder 240 to provide an accumulated value.

The delay circuit 250 provides the delayed version of the output of the second adder 240 by delaying it by one clock cycle.

The first adder 230 adds the accumulated value and the first amplified signal to get a filtered phase error signal. This filtered phase error signal is a numerical value that is indicative of a desired phase step for the generating the local clock signal.

The loop filter 120 of FIG. 2 has a transfer function as shown in Equation (1):

$$F(z) = k_1 + \frac{k_2}{1 - z^{-1}} \qquad (1)$$

The difference equation for the loop filter 120 is shown in Equation (2):

$$y(n)=y(n-1)+(k_1+k_2)x(n)+k_1x(n-1) \qquad (2)$$

A phase-locked loop (PLL) with a type 2 digital filter has the property that its steady-state phase error converges to zero for both phase and frequency offsets, and it can track a changing frequency proportional to the loop bandwidth.

Figure 3:
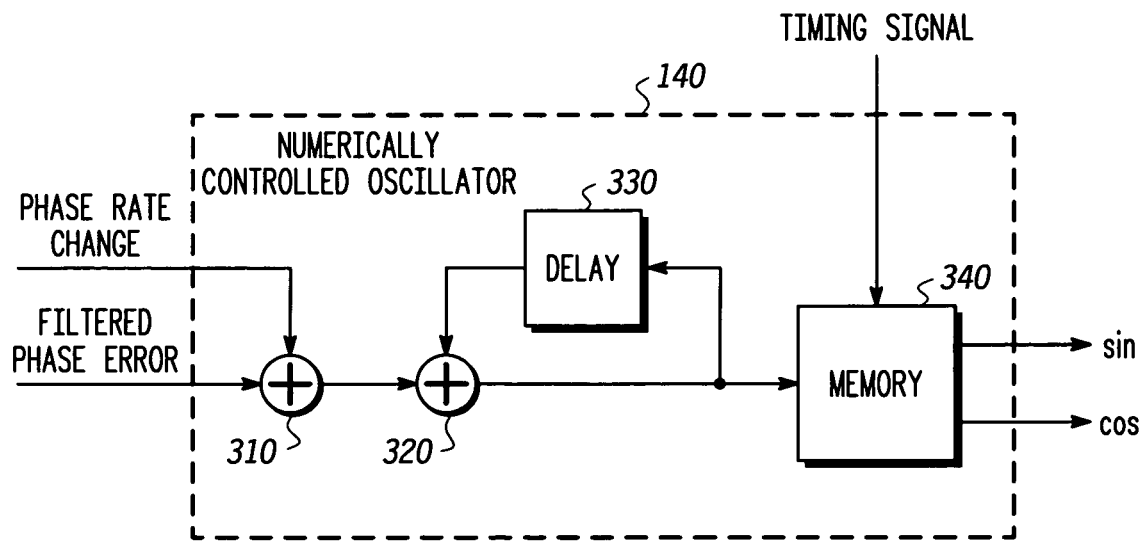
FIG. 3 is a diagram of the numerically-controlled oscillator of FIG. 1, according to a disclosed embodiment of the present invention.

FIG. 3 is a diagram of the numerically-controlled oscillator (NCO) of FIG. 1 according to a disclosed embodiment of the present invention. As shown in FIG. 3, the NCO includes a first adder 310, a second adder 320, a delay circuit 330, and a memory element 340.

The first adder 310 adds the filtered phase error signal and a phase rate change signal to provide a phase changing signal that is used to determine the phase step used to generate the local clock signal. The filtered phase error signal indicates a desired phase change for the local clock signal relative to a timing signal, based on a nominative frequency used by the received signal. The phase rate change signal indicates any iterative change in phase needed for the local clock signal. And since a constant repeated change in phase corresponds to a change in frequency, the phase rate change input is used to account for a frequency offset used in the received signal.

The second adder 320 adds the current value of the phase change signal output from the first adder 310 with a delayed version of the output of the second adder 320 to provide a phase selection signal. In this embodiment the second adder 320 performs a modulo operation based on a maximum size of the second adder 320. In other words, when the phase change signal output from the second adder 320 exceeds its maximum size, it loops back to zero and continues counting from there.

The delay circuit 330 provides the delayed version of the output of the second adder 320 by delaying it by one clock cycle.

The memory element 340 outputs a complex clock signal (i.e., a sine and cosine pair) based on the phase selection signal and a timing signal. In the disclosed embodiment the memory element is a lookup table that includes values for sine and cosine at a granularity corresponding to the length of the phase change signal. However, in alternate embodiments the memory element 340 can be any sort of memory structure that could hold sine and cosine values.

At each cycle of the timing signal, the memory element 340 outputs the sine and cosine values that correspond to the phase change signal. As a result, when the values of the filtered phase error output from the loop filter 120 and the phase rate change are altered, the phase and frequency of the local clock signal are likewise changed.

The NCO 140 and zero order hold are characterized as an integrator with a zero-order hold, as shown in Equation (3):

$$V(z) = \frac{K_V z^{-1}}{1 - z^{-1}}, \tag{3}$$

where $K_v$ is a direct digital synthesis (DDS) ROM gain:

$$K_V = \frac{2\pi}{2^b} \tag{4}$$

where b is the bit length of the signal given to the NCO 140. For example, in the disclosed embodiment the second adder 320 in the NCO 140 is a 24 bit accumulator, so b is 24.

Referring to FIG. 1, the open loop transfer function for this circuit can written as shown in Equation (5):

$$\frac{Y(z)}{E(z)} = KF(z)V(z), \tag{5}$$

where Y(z) is the local clock signal, E(z) is the digital phase error signal, and K is an overall loop gain constant defined in Equation (6):

$$K = K_v K_d, \tag{6}$$

where $K_d$ is a gain of the phase detector:

$$K_d = G_{DAC} \cdot \text{ErrSlope}. \tag{7}$$

where GDAC is a gain value of the DAC 170, and ErrSlope is a gain value of a signal passing through the receive channel 110.

This closed loop transfer function using unity feedback is shown in Equation (8):

$$\frac{Y(z)}{R(z)} = \frac{KF(z)V(z)}{1 + KF(z)V(z)}, \tag{8}$$

where R(z) is the incoming signal.

Substituting from Equations (1) and (3), Equation (8) can be rewritten as:

$$\frac{Y(z)}{R(z)} = \frac{z^{-1}[K(k_1 + k_2) - z^{-1}k_1]}{1 + z^{-1}(K(k_1 + k_2) - 2) + (1 - Kk_1)z^{-2}}. \tag{9}$$

The closed loop transfer function has second order characteristics. Because it contains two ideal integrators, it is also a type II control loop. General format for a continuous time second-order lag filter is:

$$H(s) = \frac{1}{1 + 2\zeta(s/w_n) + (s^2/w_n^2)}, \tag{10}$$

where $w_n$ is the natural frequency of the closed loop in radians/second, and $\zeta$ is a loop damping factor.

And the impulse-invariant Z-transform has the following general form:

$$H(z) = \frac{z^{-1} \frac{w_0 T}{\sqrt{1-\zeta^2}} e^{(-\zeta w_0 T)} \sin(w_n \sqrt{1-\zeta^2}\, T)}{1 - z^{-1} 2 e^{(-\zeta w_0 T)} \cos(w_0 \sqrt{1-\zeta^2}\, T) + z^{-2} e^{(-2\zeta w_0 T)}} \tag{11}$$

where T is the system sample rate.

In this form, the loop natural frequency $w_n$ and damping factor $\zeta$ exist in the denominator. Equating the denominators of the general form and the closed form solution above, results in Equation (12):

$$1 + z^{-1}(K(k_1+k_2)-2)+(1-Kk_1)z^{-2} = 1 - z^{-1} 2 e^{(-\zeta w_n T)}\cos(w_n \sqrt{1-\zeta^2}T) + z^{-2} e^{(-2\zeta w_n T)}. \tag{12}$$

Combining like terms produces the following:

$$z^{-1} \Rightarrow (K(k_1+k_2)-2) = -2e^{(-\zeta w_n T)}\cos(w_n\sqrt{1-\zeta^2}T), \text{ and} \tag{13}$$

$$z^{-2} \Rightarrow (1-Kk_1) = e^{(-\zeta w_n T)} \tag{14}$$

Solving for $k_1$ and $k_2$ produces the following:

$$k_1 = \frac{1 - e^{(-2\zeta w_n T)}}{K} \quad (15)$$

$$k_2 = \frac{2 - 2e^{(-\zeta w_n T)}\cos\left(w_n\sqrt{1-\zeta^2}\,T\right) - Kk_1}{K} \quad (16)$$

Based on these equations it is possible to select a desirable natural frequency $w_n$ and damping factor $\zeta$, and get the corresponding filter gain coefficients. And for all practical purposes, the natural frequency $w_n$ can be considered the loop bandwidth.

Tracking Process

Tracking can be performed using the tracking circuit 100 of FIG. 1 by splitting the tracking time into different time periods, and then adjusting the gain coefficients $k_1$ and $k_2$ of the loop filter 120 to pick an appropriate natural frequency $w_n$ and damping factor $\zeta$ for that period. An initial period can have $k_1$ and $k_2$ chosen to provide a high natural frequency $w_n$ and low damping factor $\zeta$, which will cause the loop filter 120 to quickly close in on a desired output value. Then, once the loop filter is close to a desired output value, later periods can have $k_1$ and $k_2$ chosen to provide a lower natural frequency $w_n$ and higher damping factor $\zeta$, which will reduce the amount of noise that enters the control loop, and thus the noise at the output of the loop filter 120 as well as the speed of convergence. As the output of the loop filter 120 gets closer and closer to its desired output value, the values of $k_1$ and $k_2$ can be further varied to reduce the variance at the cost of convergence speed.

In addition, the sample speed can also be varied to further control the noise-variance. Generally the sample speed will be at a maximum value at the start of tracking and may be reduced as tracking proceeds. This has the added advantage of giving maximum performance at the start of the tracking process, but reducing power consumption during later tracking.

Figure 4:
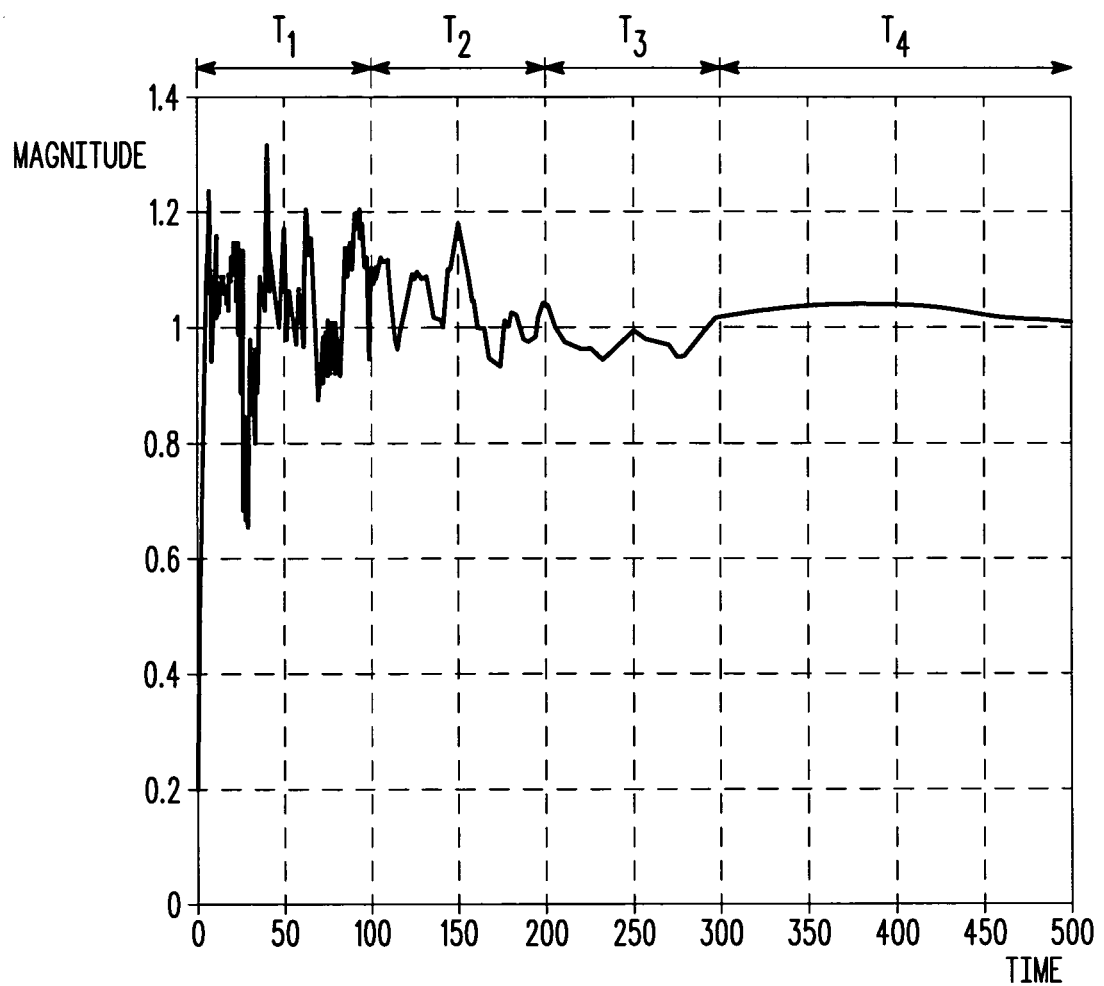
FIG. 4 is a graph of an output of the numerically-controlled oscillator of FIG. 1, normalized to a reference clock, using four changing sets of parameters for the loop filter.

FIG. 4 is a graph of an output of the numerically-controlled oscillator of FIG. 1, normalized to a reference clock, using four changing sets of parameters for the loop filter 120. Because of the normalizing in this graph, it is easy to see where a final desirable output should be, i.e., at a constant value of 1. As shown in FIG. 4, the operation of the tracking circuit 100 changes during four time periods $T_1$, $T_2$, $T_3$, and $T_4$, as the parameters of the tracking circuit 100, most particularly of the loop filter 120, change.

During the first time period $T_1$, the sample rate is kept at its maximum rate, while the first and second gain coefficients $k_1$ and $k_2$ of the loop filter 120 are set to provide a large bandwidth for the loop filter 120 (e.g., 250 KHz, with a $\zeta$ of 0.707). As shown in FIG. 4, this has the effect of very quickly bringing the output of the NCO 140 to the general range of the desired output phase and frequency. However, to get there quickly, the signal has a high variance, leading to second time period $T_2$, the sample rate is also wide swings in accuracy.

During the second time period $T_2$, the sample rate is kept at its maximum rate, but the first and second gain coefficients $k_1$ and $k_2$ of the loop filter 120 are changed to provide a narrower bandwidth for the loop filter (e.g., 200 KHz, with a $\zeta$ of 0.707). This has the effect of damping the variance in the output of the NCO 140, though it slows down the speed of convergence. However, since the parameters in the first time period $T_1$ got the output of the NCO 140 close to its desired point, the fact that it converges slower in the second time period $T_2$ does not seriously detract from the efficiency of the tracking circuit 100.

During the third time period $T_3$, the sample rate is again kept at the maximum rate, but the first and second gain coefficients $k_1$ and $k_2$ of the loop filter 120 are changed to provide an even narrower bandwidth for the loop filter (e.g., 125 KHz, with a $\zeta$ of 0.707). Again, the convergence of the output of the NCO 140 will again slow down, but after the first and second time periods $T_1$ and $T_2$, the phase and frequency of the clock signal will be very close to their desired values. However, this change in parameters will reduce the variance in the output signal of the VCO 140, allowing it to settle down to much more stable output.

Finally, during the fourth time period $T_4$ (which encompasses the remainder of the current tracking process), the sample rate is reduced, while the first and second gain coefficients $k_1$ and $k_2$ of the loop filter 120 are maintained at the same value. This will also serve to narrow the bandwidth for the loop filter (e.g., 50 KHz, with a $\zeta$ of 0.707). This will significantly reduce the speed of convergence of the output of the NCO 140, but after the first through third time periods $T_1$ to $T_3$, the phase and frequency of the clock signal should be centered around their desired values. However, this change in parameters will further reduce the noise-variance in the output signal of the VCO 140, allowing it to settle down to a very stable output. Furthermore, the reduction in sample rate will also reduce the power consumption of the tracking circuit 100.

Although FIG. 4 discloses four time periods, alternate embodiments could employ more or fewer time periods. Furthermore, the change in bandwidth in each time period can be accomplished by any combination of changing the sample rate and first and second gain coefficients $k_1$ and $k_2$.

Figure 5:
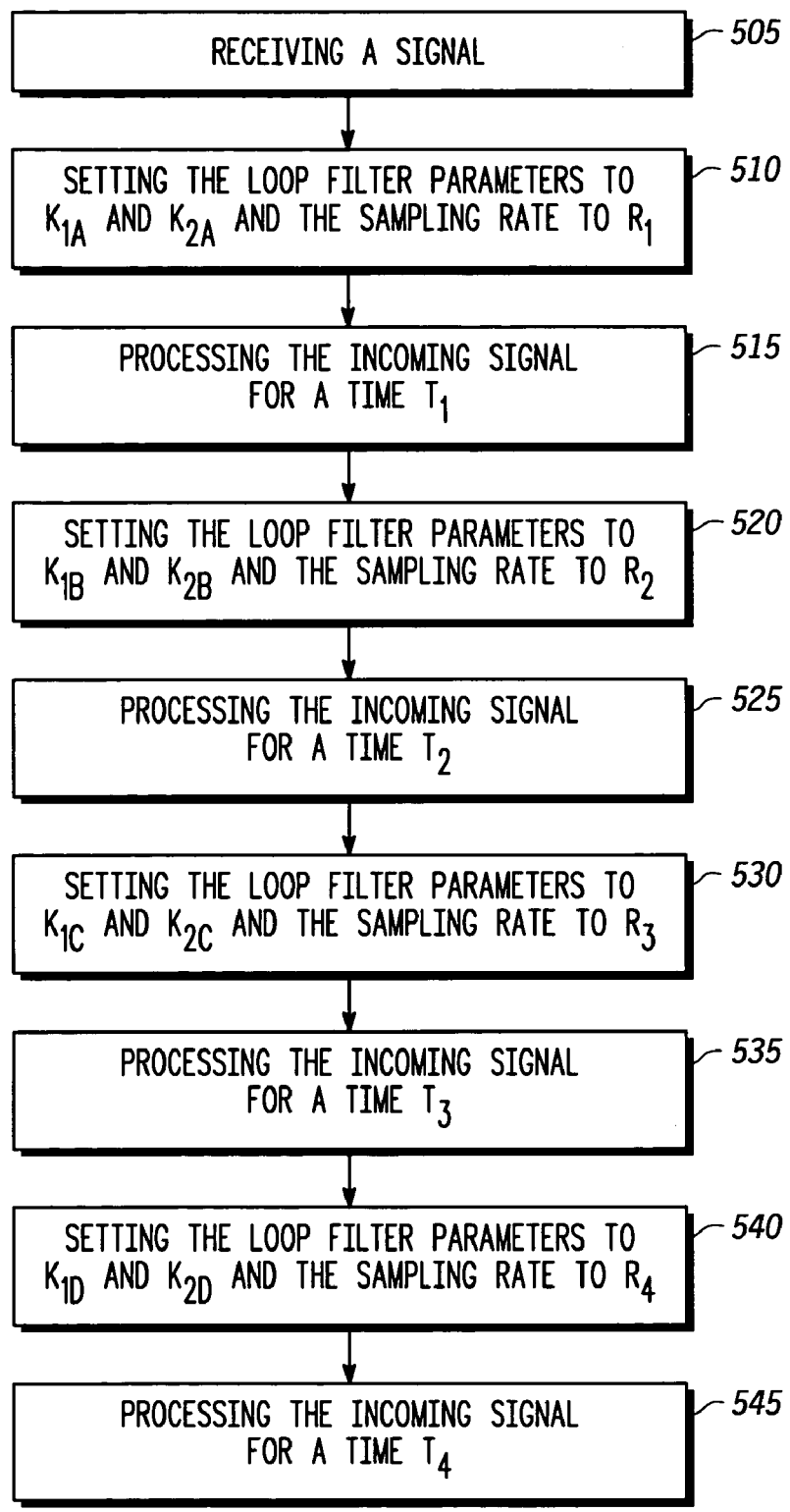
FIG. 5 is a flow chart showing the operation of the receiver circuit of FIG. 1 according to a disclosed method of operation.

FIG. 5 is a flow chart showing the operation of the receiver circuit of FIG. 1 according to a disclosed method of operation. As shown in FIG. 5, tracking begins after a device receives a signal (505). An acquisition process will generally be performed at this time, after which tracking commences.

To begin tracking, a tracking circuit 100 sets loop filter parameters to $k_{1A}$ and $k_{2A}$, and a sampling rate to $R_1$ (510). The tracking circuit 100 then processes the incoming signal using these parameters for a first time period $T_1$. (515).

Then, the tracking circuit 100 sets loop filter parameters to $k_{1B}$ and $k_{2B}$, and a sampling rate to $R_2$ (520). At least one of these parameters should be different from those used during the first time period $T_1$, though some may remain the same. The tracking circuit 100 then processes the incoming signal using these parameters for a second time period $T_2$. (525).

Then, the tracking circuit 100 sets loop filter parameters to $k_{1C}$ and $k_{2C}$, and a sampling rate to $R_3$ (530). At least one of these parameters should be different from those used during the second time period $T_2$, though some may remain the same. The tracking circuit 100 then processes the incoming signal using these parameters for a third time period $T_3$. (535).

Finally, the tracking circuit 100 sets loop filter parameters to $k_{1D}$ and $k_{2D}$, and a sampling rate to $R_4$ (540). At least one of these parameters should be different from those used during the third time period $T_3$, though some may remain the same. The tracking circuit 100 then processes the incoming signal using these parameters for a fourth time period $T_4$ (i.e., the remaining duration of a packet). (545).

In one embodiment the first through third time periods $T_1$ to $T_3$ can be set time periods, while the fourth time period $T_4$ is a remainder period, including the remainder of tracking following the first through third time periods $T_1$ to $T_3$.

Although FIG. 5 discloses a four step process for changing the parameters of the tracking circuit 100, alternate embodiments could use more or fewer.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A tracking circuit for controlling a locally-generated clock, comprising:
   a receive channel for receiving an incoming signal and a local clock, generating a local signal based on the local clock, and comparing the local signal and the incoming signal to generate a data signal and an unfiltered phase error signal;
   a loop filter for filtering the unfiltered phase error signal to provide a filtered phase error signal;
   a numerically controlled oscillator for generating a correction clock based on the filtered phase error signal;
   a filter control circuit for providing one or more filter control signals to control operational parameters of the loop filter; and
   a sample switch located between the receive channel and the loop filter for sampling the unfiltered phase error signal according to a timing signal,
   wherein the correction clock is provided to the receive channel to modify at least one of the phase and frequency of the local clock.

2. A tracking circuit for controlling a local clock, as recited in claim 1, wherein the loop filter is a type two filter.

3. A tracking circuit for controlling a local clock, as recited in claim 1, wherein the loop fitter further comprises:
   a first amplifier having a first gain value, for receiving the unfiltered phase error signal and providing a first amplified signal;
   a second amplifier having a second gain value, for receiving the unfiltered phase error signal and providing a second amplified signal;
   a first adder for adding the second amplified signal to a first delayed signal to provide an accumulated signal;
   a delay circuit for delaying the accumulated signal to provide the first delayed signal; and
   a second adder for adding the first amplified signal to the accumulated signal to provide the filtered phase error.

4. A tracking circuit for controlling a local clock, as recited in claim 3, wherein the one or more filter control signals control the first and second gain values.

5. A tracking circuit for controlling a local clock, as recited in claim 1, wherein the numerically-controlled oscillator further comprises:
   an adder for adding the filtered phase error to a delayed signal to provide an intermediate signal;
   a delay circuit for delaying the intermediate signal to provide the delayed signal; and
   a memory circuit for generating the correction clock based on the intermediate signal.

6. A tracking circuit for controlling a local clock, as recited in claim 1, wherein the incoming signal is an ultra wideband signal.

7. A tracking circuit for controlling a local clock, as recited in claim 1, wherein the sample rate of the timing signal can be changed during a tracking operation.

8. A tracking circuit for controlling a local clock, as recited in claim 1, wherein the tracking circuit is formed on an integrated circuit.

9. A tracking circuit for controlling a local clock, as recited in claim 1, wherein filter control circuit controls the operational parameters of the loop filter such that the loop filter has a first bandwidth during a first time period and a second bandwidth during a second time period.

10. A method of controlling a local clock, as recited in claim 9, wherein the first bandwidth is greater than the second bandwidth.

11. A tacking circuit for controlling a local clock, comprising:
    a receive channel for receiving an incoming signal and a local clock, generating a local signal based on the local clock, and comparing the local signal and the incoming signal to generate a data signal and an unfiltered phase error signal;
    a loop filter for filtering the unfiltered phase error signal to provide a filtered phase error signal;
    a numerically controlled oscillator for generating a correction clock based on the filtered phase error signal;
    a filter control circuit for providing one or more filter control signals to control operational parameters of the loop filter;
    a first adder for adding the filtered phase error to a phase rate change signal to produce a first intermediate signal;
    a second adder for adding the first intermediate signal to a delayed signal to provide a second intermediate signal;
    a delay circuit for delaying the second intermediate signal to generate the delayed signal; and
    a memory circuit for generating the correction clock based on the second intermediate signal,
    wherein the correction clock is provided to the receive channel to modify at least one of the phase and frequency of the local clock.

12. A tracking circuit for controlling a local clock, as recited in claim 11, wherein the correction clock is a complex clock.

13. A tracking circuit for controlling a local clock, as recited in claim 11, wherein:
    the memory circuit is a look-up table,
    a range of allowable values for the second intermediate signal are set to correspond to phases between 0 and 2.pi. radians,
    the memory circuit contains sine and cosine values for each of the range of allowable values for the second intermediate signal, and
    the correction clock is generated as a complex clock based on sine and cosine values corresponding values of the second intermediate signal.

14. A method of controlling a local clock, comprising:

receiving an incoming signal;
generating a local signal based on a local clock;
comparing the local signal with the incoming signal to generate an unfiltered phase error signal;
sampling the unfiltered phase error signal at a sample rate to generate a sampled phase error signal;
filtering the sampled phase error signal through a loop filter to provide a filtered phase error signal;
generating a correction clock based on the filtered phase error signal; and
modifying at least one of the phase and frequency of the local clock based on the correction clock
wherein operational parameters of the loop filter are periodically modified to alter the bandwidth of the loop filter, and
wherein the sample rate is modified to alter the bandwidth of the loop filter.

15. A method of controlling a local clock, as recited in claim 14, wherein the loop filter is a type 2 digital filter.

16. A method of controlling a local clock, as recited in claim 14,
wherein the loop filter comprises first and second amplifiers, having first and second gain values, respectively, and
wherein the operational parameters of the loop filter are modified by altering the first and second gain values.

17. A method of controlling a local dock, as recited in claim 14, wherein the operational parameters of the loop filter are modified such that the loop filter has a first bandwidth during a first time period and a second bandwidth during a second time period.

18. A method of controlling a local clock, as recited in claim 17, wherein the first bandwidth is greater than the second bandwidth.

19. A method of controlling a local clock, as recited in claim 14, wherein the method is implemented in an ultra wideband device.

20. A method of controlling a local clock, as recited in claim 14, wherein the method is implemented in an integrated circuit.

* * * * *